US008580993B2

(12) United States Patent
Vorsa et al.

(10) Patent No.: US 8,580,993 B2
(45) Date of Patent: Nov. 12, 2013

(54) AMINO VINYLSILANE PRECURSORS FOR STRESSED SIN FILMS

(75) Inventors: Vasil Vorsa, Coopersburg, PA (US); Andrew David Johnson, Doylestown, PA (US); Manchao Xiao, San Diego, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 621 days.

(21) Appl. No.: 12/609,542

(22) Filed: Oct. 30, 2009

(65) Prior Publication Data
US 2010/0120262 A1    May 13, 2010

Related U.S. Application Data

(60) Provisional application No. 61/113,624, filed on Nov. 12, 2008.

(51) Int. Cl.
C07F 7/10          (2006.01)
(52) U.S. Cl.
USPC ............................................. 556/410
(58) Field of Classification Search
None
See application file for complete search history.

(56) References Cited

U.S. PATENT DOCUMENTS

| 5,502,146 | A  | 3/1996  | Inoue et al.     |
| 7,122,222 | B2 | 10/2006 | Xiao et al.      |
| 7,288,145 | B2 | 10/2007 | Xiao et al.      |
| 2004/0146644 | A1 | 7/2004  | Xiao et al.   |
| 2005/0080285 | A1 | 4/2005  | Wang et al.   |
| 2006/0014399 | A1 | 1/2006  | Raymond       |
| 2006/0045986 | A1 | 3/2006  | Hochberg et al. |
| 2006/0269692 | A1 | 11/2006 | Balseanu et al. |
| 2008/0146007 | A1 | 6/2008  | Balseanu et al. |
| 2010/0190942 | A1 | 7/2010  | Hosaka et al. |

FOREIGN PATENT DOCUMENTS

| EP | 1 441 042 A1 | 7/2004 |
| EP | 1630249 A2 | 3/2006 |
| EP | 1 724 373 A1 | 11/2006 |
| EP | 1 932 941 A1 | 6/2008 |
| EP | 1724373 B1 | 7/2009 |
| EP | 2 123 445 A1 | 11/2009 |
| JP | 2001-183639 | 7/2001 |
| JP | 2004-228585 | 8/2004 |
| JP | 2005-310861 A | 11/2005 |
| JP | 2006-120992 | 5/2006 |
| JP | 2006-294485 A | 10/2006 |
| TW | 200703469 | 1/2007 |
| WO | 2006127462 A2 | 11/2006 |
| WO | 2008-096616 | 8/2008 |

OTHER PUBLICATIONS

Lauter et al Macromolecules, 1999, 32, 3426-3431).*
Billingham et al. Journal of Polymer Science: Polymer Chemistry Edition, 1977, 15, 675-681.*
Hedaya et al. Journal of Polymer Science: Polymer Chemistry Edition, 1977, 15(9), 2229-2238.*
Wrackmeyer et al. Spectrochemica Acta 1989, 45(11) 1101-1111.*
Billingham, N.C., et al.; "Cyclopolymierziation of Diallylsilanes"; Journal of Polymer Science; vol. 15; Mar. 1977; pp. 675-681.
Lauter, U., et al.; "Vinyl-Substituted Silphenylene Siloxane Copolymers: Novel High-Temperature Elastomers"; Macromolecules; vol. 32, No. 10; Apr. 30, 1999; pp. 3426-3431.
Aoki, H., et al.; "Poly(Divinylsiloxyethylene Clycol)—Synthesis and Photoresist Characteristics"; Macromolecular: Rapid Comminications; vol. 18, No. 1; Jan. 1, 1997; pp. 31-36.
Ohta, H., et al.; "Novel Stack-SIN Gate Dielectrics for High Performance 30 nm CMOS for 45 nm Node with Uniaxial Strained Silicon"; 26th Annual Symposium on VLSI Technology, Jun. 13-15, 2006; pp. 176-177.
B. Wrackmeyer, et al, 13C, 15N and 29Si nuclear magnetic resonance studies of some aminosilanes and aminodisilanes, Spectrochimica Acta, 1989, 1101-1111, 45A.
M. Belyansky et al, Methods of producing plasma enhanced chemical vapor deposition silicon nitride thin films with high compressive and tensile stress, J. Vac. Sci. Technol. A 26(3), 2008, pp. 517-521.
Scott E. Thompson et al, A logic nanotechnology featuring strained-silicon, IEEE Elec. Device Letters, vol. 25, No. 4, 2004, pp. 191-193.
David M. Hoffman et al, Plasma enhanced chemical vapor deposition of silicon nitride films from a metal-organic precursor, J. Mater. Res., vol. 9, No. 12, 1994, pp. 3019-3021.
Lauter, U., et al.; "Vinyl-Substituted Silphenylene Siloxane Copolymers: Novel High-Temperature Elastomers"; Macromolecules; vol. 32, No. 10; Apr. 30, 1999; pp. 3426-3431.
H. Aoki, et al, EB Resist Characteristics of Water Soluble Poly(siloxyethylene glycol), Journal of Photopolymer Science and Technology, 1997, 325-328.
J. Grobe, et al, Alternativ-Liganden I. Darstellung Von Chelat-Liganden Mit Si-X(CH3)2 UND C-X(CH3)2-Donor-Gruppierungen (X=N. UND/ODER P), Journal of Organometallic Chemistry, 1971, 13-23.
N. Auner, Silaheterocycles. VI. Preparation and [2+4] cycoloaddition reactions of 1-vinyl-1-chloro-3-neopentylsilaethene, Journal of Organometallic Chemistry, 1989, 175-195, 377.
Lauter,U., et al.; "Vinyl-Substituted Silphenylene Copolymers: Novel High-Temperature Elastomers"; Macromolecules; vol. 32; 1999; pp. 3426-3431.

* cited by examiner

Primary Examiner — Yevegeny Valenrod
(74) Attorney, Agent, or Firm — Rosaleen P. Morris-Oskanian

(57) ABSTRACT

The present invention is a method to increase the intrinsic compressive stress in plasma enhanced chemical vapor deposition (PECVD) silicon nitride (SiN) and silicon carbonitride (SiCN) thin films, comprising depositing the film from an amino vinylsilane-based precursor. More specifically the present invention uses the amino vinylsilane-based precursor selected from the formula: $[RR^1N]_xSiR^3_y(R^2)_z$, where $x+y+z=4$, $x=1-3$, $y=0-2$, and $z=1-3$; R, $R^1$ and $R^3$ can be hydrogen, $C_1$ to $C_{10}$ alkane, alkene, or $C_4$ to $C_{12}$ aromatic; each $R^2$ is a vinyl, allyl or vinyl-containing functional group.

3 Claims, 5 Drawing Sheets

US 8,580,993 B2

AMINO VINYLSILANE PRECURSORS FOR STRESSED SIN FILMS

CROSS REFERENCE TO RELATED APPLICATIONS

The Present Application claims the benefit of U.S. Provisional Patent Application Ser. No. 61/113,624 filed Nov. 12, 2008.

BACKGROUND OF THE INVENTION

The Present Invention is in the field of integrated circuit fabrication and particularly materials of construction in the films that are adjacent to or are a part of electronic devices in the integrated circuit, such as transistors, capacitors, vias, electrically conductive lines and buss bars. As the dimensions of such electronic devices continue to shrink and the density of such devices in a given area increases, the films adjacent to or a part of such electronic devices must exhibit higher electrical properties. Designing stress into such films can alter their electrical properties. Stress engineering of PECVD silicon nitride films is currently being used to enhance the performance of cutting edge metal oxide semiconductor field effect transistor (MOSFET) technology. Device speed has been significantly increased through the application of highly stressed SiN films deposited on top of MOSFET gate structures. Compressive stress enhances "P" type field effect transistors (pFET) devices through increases of hole mobility, while tensile stress is beneficial for "N" type field effect transistors (nFET) devices through enhancing electron mobility. Stress is generated from differences in the thermal expansion between two materials in contact. Plasma enhanced chemical vapor deposition (PECVD) silicon nitride films generally generate compressive stress. Presently, compressively stressed films are deposited using silane and ammonia with reported compressive stresses up to ~−3.5 giga pascales (GPa). Increasing compressive stress further is becoming particularly challenging. The industry is currently aiming for compressively stressed films of −4 GPa or higher.

Patents related to this technology include: US 2006/0045986; EP 1 630 249; US 2006/0258173; EP 1 724 373; U.S. Pat. No. 7,288,145; U.S. Pat. No. 7,122,222; US20060269692; WO2006/127462; and US2008/0146007, as well as the literature reference; "Methods of producing plasma enhanced chemical vapor deposition silicon nitride thin films with high compressive and tensile stress."; M. Belyansky et al. J. Vac. Sci. Technol. A 26(3), 517 (2008).

BRIEF SUMMARY OF THE INVENTION

The present invention is a method to increase the intrinsic compressive stress in plasma enhanced chemical vapor deposition (PECVD) silicon nitride (SiN) and silicon carbonitride (SiCN) thin films, comprising depositing the film from an amino vinylsilane-based precursor.

More specifically the present invention uses the amino vinylsilane-based precursor selected from the formula:

where x+y+z=4, x=1-3, y=0-2, and z=1-3; R, $R^1$ and $R^3$ can be hydrogen, $C_1$ to $C_{10}$ alkane, alkene, or $C_4$ to $C_{12}$ aromatic; each $R^2$ is a vinyl, allyl or vinyl-containing functional group.

DETAILED DESCRIPTION OF THE INVENTION

Figure 1A:
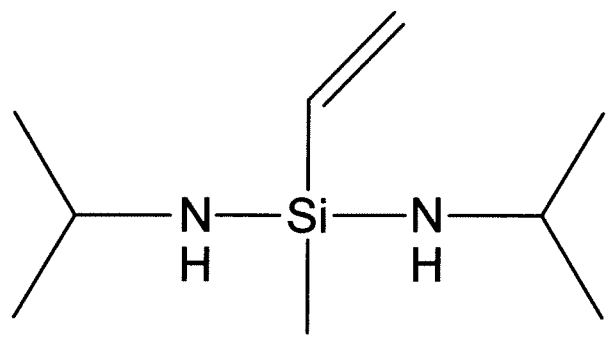
FIGS. 1 A and B are depictions of structural formulae of species of chemical precursors for the present invention.

The present invention provides amino vinylsilane-based precursors as a way to increase the intrinsic compressive stress in plasma enhanced chemical vapor deposition (PECVD) silicon nitride (SiN) and silicon carbonitride (SiCN) thin films. The main feature of these amino vinylsilane precursors is one or two vinyl functional groups bonded to the central silicon atom. The precursors have the general formula:

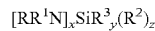

where x+y+z=4, x=1-3, y=0-2, and z=1-3. R, $R^1$ and $R^3$ can be hydrogen, $C_1$ to $C_{10}$ alkane, alkene, or $C_4$ to $C_{12}$ aromatic; each $R^2$ is a vinyl, allyl or other vinyl-containing functional group. The addition of a vinyl group to the aminosilane is found to increase the intrinsic compressive stress of SiN and SiCN films deposited using these precursors.

The amino vinylsilane precursors include, but not limited to, Bis(isopropylamino)vinylmethylsilane (BIPAVMS), Bis(isopropylamino)divinylsilane (BIPADVS), Bis(isopropylamino)vinylsilane, Bis(isopropylamino)allylmethylsilane, Bis(isopropylamino)diallylsilane, Bis(isopropylamino)allylsilane, Bis(t-butylamino)vinylmethylsilane, Bis(t-butylaminoamino)divinylsilane, Bis(t-butylaminoamino)vinylsilane, Bis(t-butylamino)allylmethylsilane, Bis(t-butylamino)diallylsilane, Bis(t-butylamino)allylsilane, Bis(diethylamino)vinylmethylsilane, Bis(diethylamino)divinylsilane, Bis(diethylamino)vinylsilane, Bis(diethylamino)allylmethylsilane, Bis(diethylamino)diallylsilane, Bis(diethylamino)allylsilane, Bis(dimethylamino)vinylmethylsilane, Bis(dimethylamino)divinylsilane, Bis(dimethylamino)vinylsilane, Bis(dimethylamino)allylmethylsilane, Bis(dimethylamino)diallylsilane, Bis(dimethylamino)allylsilane, Bis(methylethylamino)vinylmethylsilane, Bis(methylethylamino)divinylsilane, Bis(methylethylamino)vinylsilane, Bis(methylethylamino)allylmethylsilane, Bis(methylethylamino)diallylsilane, Bis(methylethylamino)allylsilane, Dipiperidinovinylmethylsilane, Dipiperidinodivinylsilane, Dipiperidinovinylsilane, Dipiperidinoallylmethylsilane, Dipiperidinodiallylsilane, Dipiperidinoallylsilane, Dipyrrolidinovinylmethylsilane, Dipyrrolidinodivinylsilane, Dipyrrolidinovinylsilane, Dipyrrolidinoallylmethylsilane, Dipyrrolidinodiallylsilane, Dipyrrolidinoallylsilane.

The particular precursor used in tests is Bis(iso-propylamino)vinylmethylsilane (BIPAVMS). Another similar precursor is Bis(iso-propylamino)divinylsilane (BIPADVS).

Stress engineering of PECVD silicon nitride films is currently being used to enhance the performance of cutting edge MOSFET technology. Device speed has been significantly increased through the application of highly stressed SiN films deposited on top of MOSFET gate structures. Compressive stress enhances pFET devices through increases of hole mobility, while tensile stress is beneficial for nFET devices through enhancing electron mobility. Stress is generated from differences in the thermal expansion between two materials in contact. PECVD silicon nitride films generally generate compressive stress. Presently, compressively stressed films are deposited using silane and ammonia with reported compressive stresses up to ~−3.5 GPa. Increasing compressive stress further is becoming particularly challenging. The industry is currently aiming for compressively stressed films of −4 GPa or higher.

The goal of −4 GPa compressively stressed films may be realized through the use of the above described amino vinylsilane precursors. In the present invention, compressive stress of −0.7 to −4.5 GPa (−700 to −4500 MPa) can be obtained. Up to now, most of the increases in stress generation have been through processing techniques, such as plasma surface treatment, multilayer deposition, dual frequency plasma and other similar methods. This invention is the first to specifically use a unique type of silicon-containing precursor to increase film stress.

Standard deposition methods have a limit to the amount of stress they can generate. Current targets for stress are 1.5 GPa for tensile stress and −4 GPa for compressive stress.

It has been observed that higher hydrogen incorporation into SiN films leads to higher compressive stress. We propose that PECVD SiN films deposited using amino vinylsilanes such as BIPADVS and BIPAVMS can generate highly compressive stress due to overall hydrogen incorporation and, moreover, through the type of hydrogen incorporation, i.e. nitrogen bonded hydrogen vs silicon bonded hydrogen. We have shown for both bis(tertiary-butylamino)silane (BTBAS) and BIPAVMS a strong correlation between N—H to Si—H ratio and compressive stress, with high N—H to Si—H ratio leading to higher compressive stress. Films deposited using a mixture of an aminosilane and ammonia naturally lead to films containing high N—H to Si—H content through transamination reactions.

Furthermore, aminosilanes containing vinyl functional groups, such as BIPADVS and BIPAVMS, have been found to increase compressive stress further. Vinyl groups play important roles in creating film stress. Under plasma conditions, carbon-carbon double bonds may form cross-linking points, which increase the density of film by holding atoms closer. Si—H bonds of the precursor react with carbon-carbon double bonds with hydrosilylation reaction, forming ethylene bridges between silicon atoms. Ethylene bridges hold the silicon atoms close, and are consequently replaced by ammonia, and that process helps the formation of Si—N—Si structure.

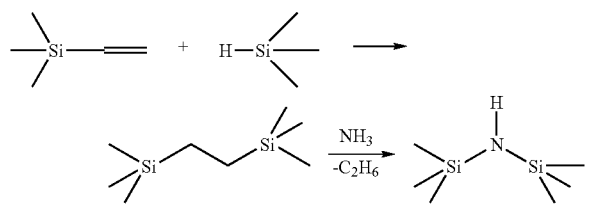

The present invention is directed to overcome limits of intrinsic stress generation through the use of this special class of aminosilane precursors, namely amino vinylsilanes, to deposit highly stressed silicon nitride (SiN) films or silicon carbonitride (SiCN) films using PEVCD. The addition of a vinyl group to the aminosilane is found to increase the intrinsic compressive stress of SiN and SiCN films deposited using these precursors.

Figure 1B:
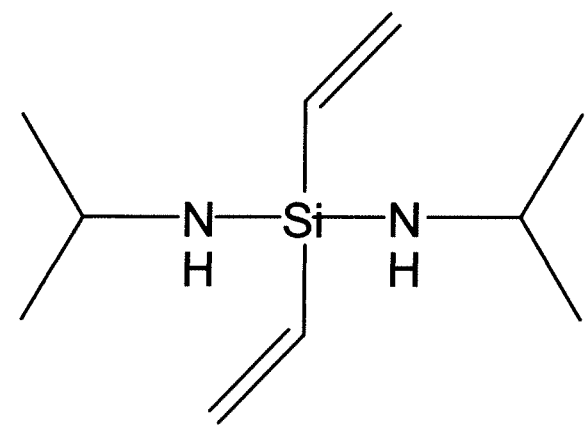

To deposit compressively stressed silicon nitride or silicon carbonitride films, the amino vinylsilane is reacted with a nitrogen-containing gas in a PECVD chamber at wafer temperatures of 500° C. or less. The nitrogen containing gas can be ammonia, nitrogen, or a combination thereof. Additionally, a diluent gas such as, but not limited to, He, Ar, Ne, Xe, or hydrogen can be introduced to modify the film properties. For example, Bis(iso-propylamino)vinylmethylsilane (BIPAVMS) (FIG. 1 A) or Bis(iso-propylamino)divinylsilane (BIPADVS) (FIG. 1 B) and ammonia are introduced into a PECVD chamber and allowed to react, resulting in the deposition of a compressively stressed SiN thin film. A suitable BIPAVMS flow rate may range from 50 to about 1000 mg/min. A suitable ammonia and/or nitrogen flow rate may range from 500 to 10,000 sccm, and the diluent gases can range from 50 to 50,000 sccm.

EXAMPLE

Depositions conditions for Runs A-F and the corresponding film stress obtained in Table 1, below, are as follows. Deposition temperature was 400 C. In these examples, properties were obtained from sample films that were deposited onto medium resistivity (8-12 Ωcm) single crystal silicon wafer substrates. All depositions were performed on an Applied Materials Precision 5000 system in a 200 mm DXZ chamber fitted with an Advanced Energy 2000 RF generator. The plasma is single frequency of 13.56 MHz.

In the Table 1 examples, thickness and optical properties, such as refractive index of the dielectric films, were measured on an SCI Filmtek Reflectometer. The refractive index is measured using 632 nm wavelength light. Fourier Infrared Spectroscopy (FTIR) data was collected on the wafers using a Thermo Nicolet 750 system in a nitrogen purged cell. Background spectra were collected on similar medium resistivity wafers to eliminate $CO_2$ and water from the spectra. Data was obtained in the range of from 4000 to 400 $cm^{-1}$ by collecting 32 scans with a resolution of 4 $cm^{-1}$. The OMNIC software package was used to process the data. Film stress measurements were made using a laser beam scattering tool (Toho Technology Corp., Model: FLX2320S).

TABLE 1

| Film | BIPAVMS flow (mg/min) | NH3 (sccm) | P (Torr) | Power (W) | Stress (MPa) |
| --- | --- | --- | --- | --- | --- |
| A | 250 | 2500 | 2.5 | 400 | −1849 |
| B | 250 | 1250 | 2.5 | 400 | −934 |
| C | 250 | 2500 | 4 | 400 | −757 |
| D | 250 | 2500 | 2.5 | 600 | −2249 |
| E | 125 | 2500 | 2.5 | 400 | −2357 |
| F | 125 | 2500 | 2.5 | 600 | −2260 |

Figure 2:
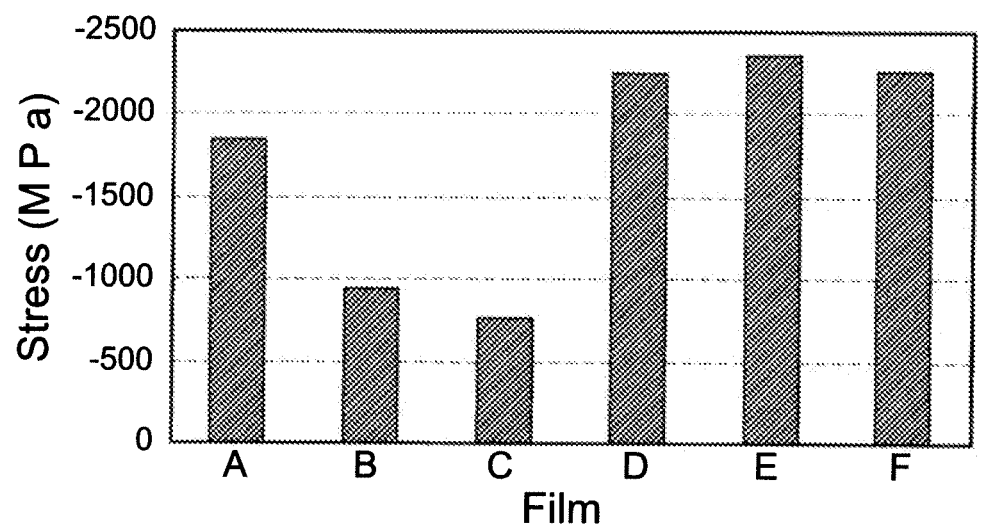
FIG. 2 is a graph of stress values for films formed by PECVD depositions of BIPAVMS and ammonia under various process conditions.

Film stress data of silicon nitride films deposited at 400° C. using Bis(iso-propylamino)vinylmethylsilane and ammonia is shown in FIG. 2. The films were deposited under various process conditions, such as precursor and gas flow rate, pressure, and RF power. The films were single layer, with thicknesses ranging from 100 to 350 nm. The plasma was generated using a single frequency of 13.56 MHz. The compressive stress of these films ranged from −700 to −2400 mega pascales (MPa). These films produced ~1.5 to 1.8× higher compressive stress, than BTBAS under comparable process conditions.

Figure 3:
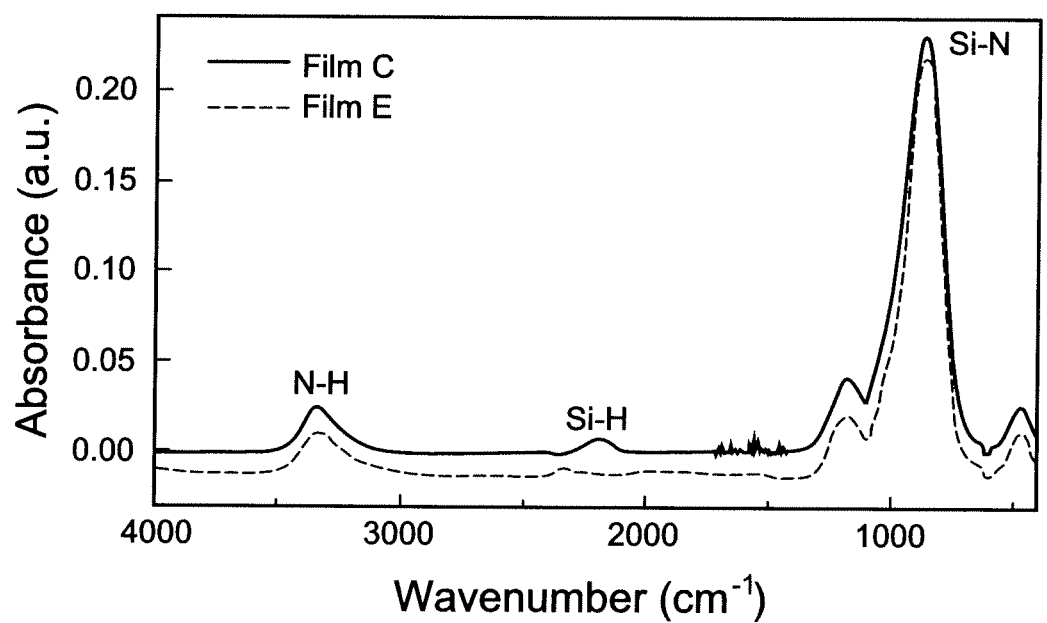
FIG. 3 is a FTIR spectra of silicon nitride films deposited with PECVD using BIPAVMS and ammonia.

FIG. 3 shows the FTIR spectra of films from FIG. 2 with the lowest (Film C) and highest (Film E) compressive stress. Both films exhibit $NH_x$ stretching and bending modes of similar intensity. However, there is a distinct difference in the SiH peak at ~2190 cm$^{-1}$, thus suggesting the main difference is in whether hydrogen is bonded to nitrogen or silicon.

Figure 4:
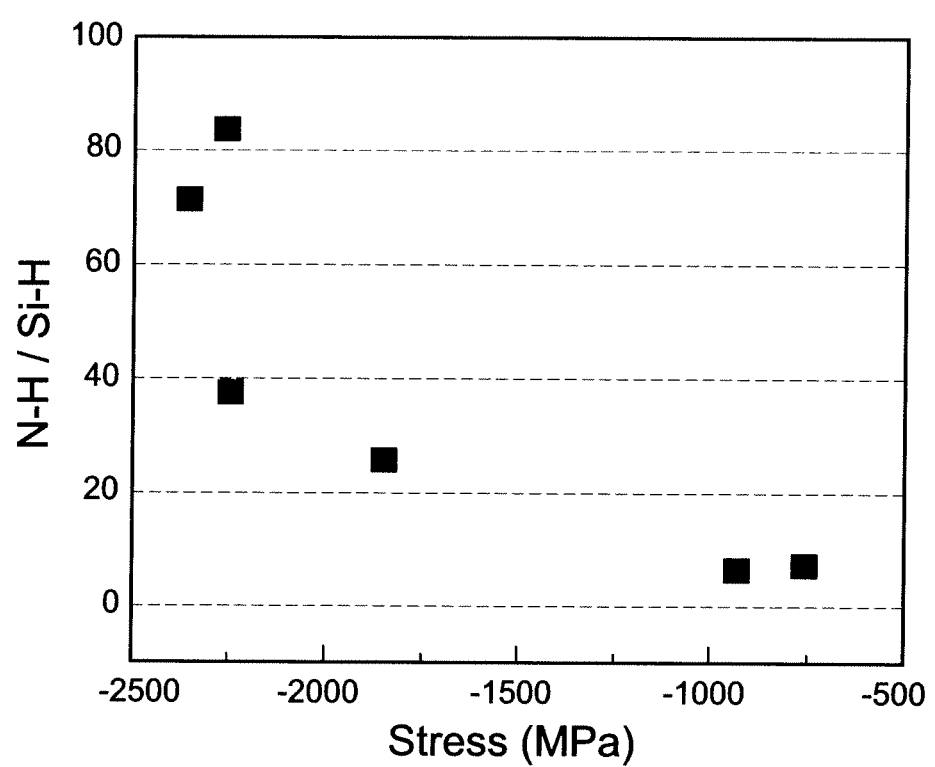
FIG. 4 is a graph plotting the ratio of nitrogen bonded hydrogen ($NH_x$) to silicon bonded hydrogen (SiH) content versus film stress.

FIG. 4 depicts the correlation between the ratio of $NH_x$ to SiH with stress. As can be seen from this figure, stress increases with higher $NH_x$ to SiH ratio. Preferably, the deposited thin film has a N—H to Si—H ratio of 25 to 85, most preferably 70.

Figure 5:
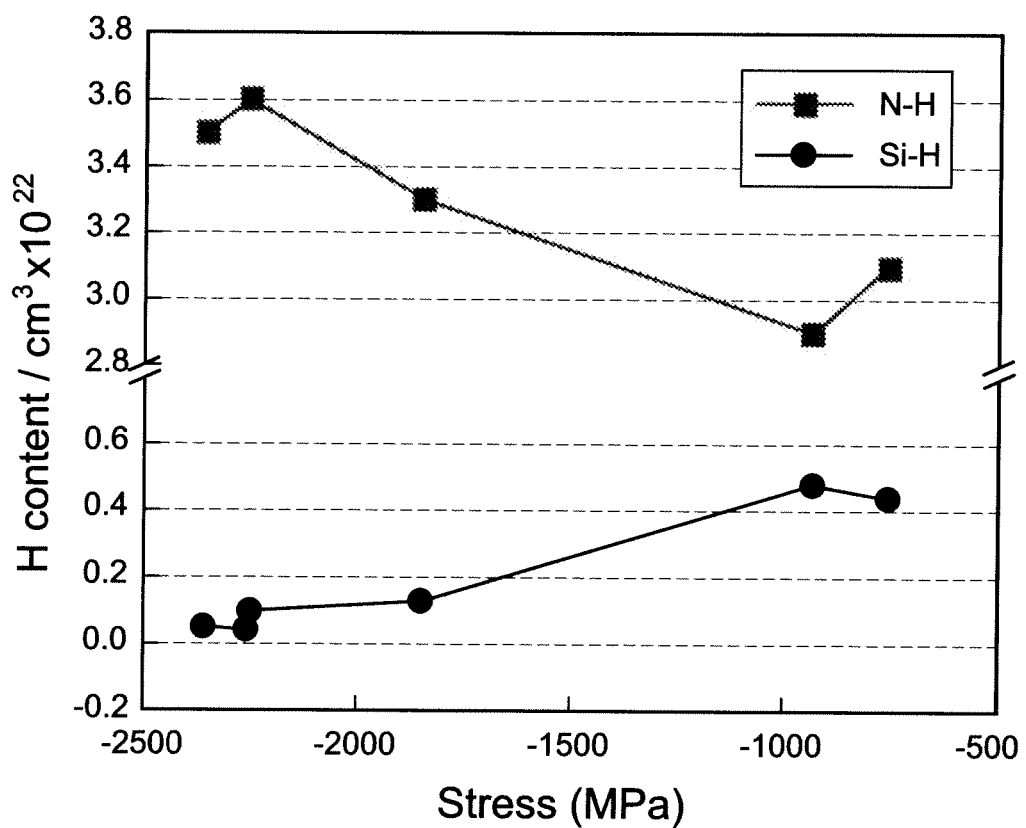
FIG. 5 is a graph plotting $NH_x$ and SiH content versus film stress.

FIG. 5 depicts the correlation of nitrogen bonded hydrogen ($NH_x$) to stress and silicon bonded hydrogen to stress. This data indicates that reduction of SiH groups in addition to high levels of $NH_x$ moiety is important in generating high levels of compressive stress. Hydrogen contents derived from $NH_x$ moieties increase compressive stress in the range of 2.9 to 3.5 H content/cm$^3$×10$^{22}$, preferably 3.3 to 3.6 H content/cm$^3$×10$^{22}$ Experimental data indicate that films possessing higher stress values were found not to contain carbon. It is inferred that the carbon is etched away by the ammonia, which is in high excess compared to the precursor. In higher stress SiN films, more Si—H bonds are removed by the hydrosilylation of vinyl group, and replaced with N—H by the removal of ethylene bridge by ammonia.

Example 2

Under process condition A listed in Table 1, the stress of films using non-vinyl precursor (such as BTBAS) is lower than that for (BIPAVMS)

TABLE 2

| Precursor | Thickness (nm) | Dep. Rate (nm/min) | RI | Stress (MPa) |
|---|---|---|---|---|
| BIPAVMS | 208 | 13.9 | 1.97 | −1849 |
| BTBAS | 136 | 13.6 | 1.97 | −1034 |

Example 3

Under process condition A listed in Table 1, but an alternative tool and showerhead configuration, the stress of films deposited increases as the number of vinyl groups increases in precursor.

TABLE 3

| Precursor | Vinyl groups | Stress (MPa) |
|---|---|---|
| BIPAVMS | 1 | −1200 |
| BIPADVS | 2 | −1705 |

The invention claimed is:

1. A precursor for depositing a film selected from a silicon nitride and a silicon carbonitride film having the general formula: $[RR^1N]_x SiR^3_y (R^2)_z$ where x+y+z=4, x=1-3, y=0-2, and z=1-3; and wherein R, $R^1$ and $R^3$ are individually selected from the group consisting of hydrogen, $C_1$ to $C_{10}$ alkane, $C_2$ to $C_{10}$ alkene, or $C_4$ to $C_{12}$ aromatic; $R^2$ is selected from the group consisting of a vinyl, allyl or other vinyl-containing functional group and wherein when $R^2$ is vinyl or allyl, x=2, and y=0 or 1 R and $R^1$ cannot both be methyl or ethyl and wherein when $R^2$ is vinyl, $R^3$ cannot be methyl.

2. The precursor of claim 1 selected from the group consisting of Bis(isopropylamino)divinylsilane (BIPADVS), Bis(isopropylamino)diallylsilane, Bis(t-butylamino)divinylsilane, Bis(t-butylamino)diallylsilane, Bis(methyethylamino)diallylsilane, and Bis(methyethylamino)divinylsilane.

3. The precursors of claim 1 selected from the group consisting of Bis(isopropylamino)vinylsilane, Bis(isopropylamino)allylmethylsilane, Bis(isopropylamino)allylsilane, Bis(t-butylamino)vinylsilane, Bis(t-butylamino)allylmethylsilane, Bis(t-butylamino)allylsilane, Bis(methyethylamino)vinylsilane, Bis(methyethylamino)allylmethylsilane, and Bis(methyethylamino)allylsilane.

* * * * *